United States Patent [19]

Kaito

[11] Patent Number: 4,950,498
[45] Date of Patent: Aug. 21, 1990

[54] PROCESS FOR REPAIRING PATTERN FILM

[75] Inventor: Takashi Kaito, Tokyo, Japan

[73] Assignee: Seiko Instruments Inc., Japan

[21] Appl. No.: 20,115

[22] Filed: Feb. 27, 1987

[51] Int. Cl.$^5$ .......................... B05D 3/06; H05H 1/46
[52] U.S. Cl. ...................................... 427/38; 427/39;
427/140; 430/5; 156/643
[58] Field of Search ............... 430/5; 427/38, 39, 140;
250/309, 492.3; 156/643

[56] References Cited

U.S. PATENT DOCUMENTS

| | | | |
|---|---|---|---|
| 4,341,592 | 7/1982 | Shortes et al. | 430/328 |
| 4,463,073 | 7/1984 | Miyauchi et al. | 427/53.1 |
| 4,489,102 | 12/1984 | Olmer et al. | 427/54.1 |
| 4,503,329 | 3/1985 | Yamaguchi et al. | 250/309 |
| 4,609,809 | 9/1986 | Yamaguchi et al. | 219/121 EM |
| 4,649,099 | 3/1987 | Oguchi | 430/313 |

FOREIGN PATENT DOCUMENTS

| | | | |
|---|---|---|---|
| 0075949 | 4/1983 | European Pat. Off. | |
| 0150226 | 11/1980 | Japan | 430/5 |
| 0114950 | 9/1981 | Japan | 430/5 |
| 0086830 | 5/1985 | Japan | 430/5 |
| 60-94728 | 5/1985 | Japan | |
| 0236233 | 11/1985 | Japan | 250/492.3 |
| 0254729 | 12/1985 | Japan | 430/5 |

OTHER PUBLICATIONS

Patent Abstracts of Japan, vol. 9, No. 19 (E-292) [1742], Jan. 25, 1985.
Patent Abtracts of Japan, vol. 9, No. 193 (E-334) [1916], Aug. 9, 1985.
Extended Abstracts of the 16th (1984 International) Conference on Solid State Devices and Materials, Kobe, 1984, pp. 31-34, Tokyo, Jp., K. Gamo et al., "Characteristics of Selective Deposition of Metal Organic Films Using Focused Ion Beams".

Primary Examiner—Norman Morgenstern
Assistant Examiner—Margaret Bueker
Attorney, Agent, or Firm—Bruce L. Adams; Van C. Wilks

[57] ABSTRACT

This invention is concerned with the method and apparatus for forming a pattern on a substrate. More specifically, it is intended to remove the fringe of the film thinly attached at the sides of the film formed at the time of forming by CVD method and thereby to make a film of high quality. In this invention, by adding the method and means of selectively removing the fringe of the film to the method and device of forming a pattern film on the principle of so-called ion beam CVD method, the method and apparatus of forming a pattern film for making a mask or IC of high quality can be obtained without a problem of the fringe of the film at the sides of the pattern.

8 Claims, 2 Drawing Sheets

PROCESS FOR REPAIRING PATTERN FILM

BACKGROUND OF THE INVENTION

Conventionally, a mask-repairing method on the principle of the ion beam CVD method has been proposed. See, for example, Proc. 9th Symp. on ISIAT 786, P657-664.

A process for forming a pattern film comprises irradiating a specific portion of a substrate on which a pattern film is to be formed with a focused ion beam, and spraying directly a vapor stream of a polymerizable or carbonizable organic compound at and around the area being irradiated with the focused ion beam to thereby polymerize or carbonize the organic compound at said specific portion to form a desired pattern film thereon. Also it is possible to form an electric conductive film by using a vapor of metalizable compound in the above method.

The conventional methods have various problems as described below.

The white-spot defects in the patterned film mask appear to be completely repaired by the above-mentioned conventional technique, insofar as judged from the standpoint of light-transmitting observation and the mask defects inspection. However, by copying the mask pattern by means of an exposure device, it becomes clear that at the sides of the repaired portion where an opaque film has been formed, film fringes are made according to the exposure condition. Therefore, the exposure condition is restricted. To explain this in detail, as a result of inspection by means of reflected light, analysis of the secondary ion mass and the like, it can be shown that an extremely thin (several tens Å) film fringe (which has the same quality as that of the light shielding film formed for repairing) is made at the sides of the repaired -portion (where an opaque film is formed). The film fringe reflects and absorbs light, so that the light-transmitting rate is a little lowered. Accordingly, this brings about the problem of the exposure condition. Similarly, when an electric-conductive pattern film is formed on a semiconductive device such as an IC, by the above conventional method, the film sometimes shows an electrical defect by the fringe of the film.

SUMMARY OF THE INVENTION

According to the present invention, a light-shielding film or an electric conductive film formed by means of the ion beam assist CVD method is treated so that the film fringes formed at the sides of the light-shielding film or the electric conductive film are removed by a method such as reactive plasma etching or the like.

More particularly, according to the present invention, light-shielding films are formed in the white spot defects of the mask to repair the defects or electric conductive films are formed on the semi-conductive device by means of the ion beam CVD method. After the films are formed on the substrate, the fringes of the film at the sides of the light-shielding film or the electric conductive film are removed by selectively removing the film fringes, such as by reactive plasma etching. Consequently, the white spot defects or electrical defects can be completely repaired so as to make a mask of high quality.

It is an object of the invention to provide a film having fine pattern edges.

Another object of the invention is to provide an electric conductive film having fine edges.

Other and further objects, features and advantages of the invention will become more fully apparent from the following description.

DETAILED DESCRIPTION OF THE INVENTION

Figure 1:
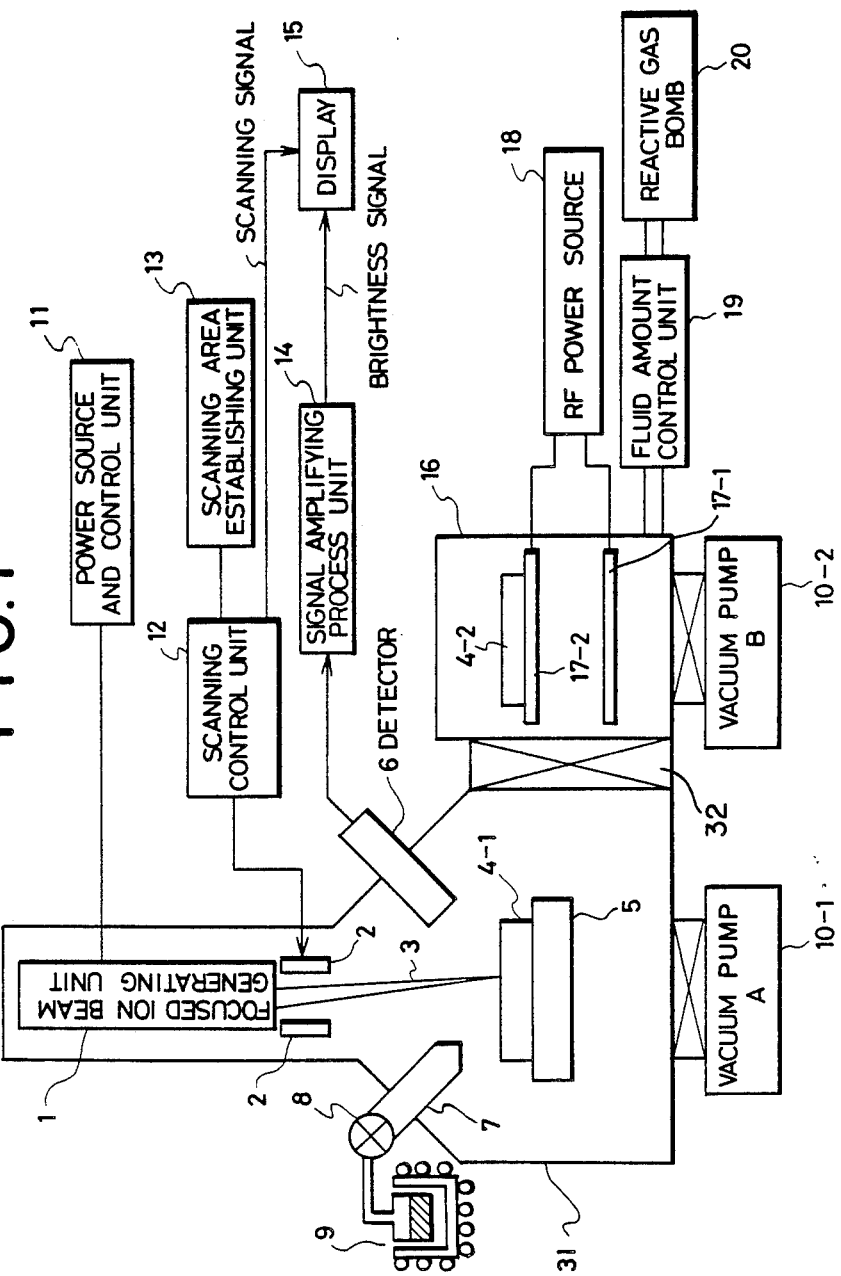
FIG. 1 shows one embodiment of apparatus for carrying out the process of this invention.

This invention will be explained in more detail with reference to the drawings.

A gas source 9 contains a compound for spraying a compound gas to a substrate. A vacuum pump 10-1 is connected to a main chamber 31 and a vacuum pump 10-2 is connected to a preparatory room 16.

The focused ion beam 3 generated by a focused ion beam generating unit 1 is projected to a patterned film mask 4-1 placed on an X-Y stage 5 and scanned on the mask 4-1 by deflecting electrodes 2. The secondary electrons or the like, emitted from the surface of the mask 4-1, are detected by a detector 6, amplified and processed by a signal amplifying process unit 14, and visually displayed on a display 15 as a SIM image or the like. The position of the mask 4-1 observed on the display 15 is transferred or adjusted by instructions from a sample transferring control unit (not shown) which drives the X-Y stage 5. In this manner, it is possible to observe the SIM image of the mask 4-1 and to determine exactly the positions of the defects to be repaired. In the above manner, the X-Y stage 5 is driven so that the portions of defects to be repaired can be indicated on the display 15 as a SIM image.

Next, the area of scanning is determined by a scanning area establishing unit 13 so that only the portions of the defects shown on the display 15 can be repeatedly scanned a predetermined number of times. A valve 8 of a gas gun is opened at the start of the white-spot defect repairing. Then, pyrene ($C_{16}H_{10}$) gas, as an example, is directed onto the surface of the mask 4-1. At the same time, the focused ion beam 3 whose scan is controlled by the scanning area establishing unit 13 irradiates the white spot defects of the mask 4-1 and dissolves the absorbed pyrene gas so as to make a hard carbon film. The carbon film is excellent in light-shielding and adhesion.

The carbon film achieves the specified strength for light-shielding at about 2,000 Angstrom in thickness. As stated above, light-shielding films are formed in the white-spot defects so as to repair the defects. When the white-spot defects are repaired in this way, however, fringe areas of several tens Angstrom thick (formed of hard carbon material) are formed at the sides of the light shielding film. Thus, the contrast of the mask is lowered, so that the condition of exposure is restricted. To remedy this drawback, after all the defects of the mask 4-1 are completely repaired, the following treatment is given in order to remove the fringe areas of the film.

The patterned film mask 4-1, having all of its defects completely repaired, is transferred from the X-Y stage 5 in the main chamber 31 onto a stage and electrode 17-1 in the preparatory discharge and plasm process room 16. Another patterned film mask 4-2, which is to be subsequently repaired, is transferred from a stage and electrode 17-2 onto the X-Y stage 5 in the main chamber 31. When the transferring is completed, a gate valve 32 for dividing the preparatory discharge and plasma process room 16 and the main chamber 31 with the X-Y stage 5 is closed. Oxygen gas is then introduced from a reactive gas bomb 20 into the preparatory discharge and plasma process room 16 by a fluid amount control unit 19 so that the gas pressure within the room 16 reaches the proper level. In addition, by operating an R-F power source 18, RF voltage is applied between the stage and electrode 17-1 and the stage and electrode 17-2 so as to generate oxygen plasma, and the mask 4-1, which has been transferred onto the stage and electrode 17-1, is given oxygen plasma etching for a specified period of time. Then the pressure within the preparatory discharge and reactive plasma etching room 16 is returned to atmosphere pressure, and by opening the front door of the etching room, the mask 4-1 which has been repaired is taken out. Further, the mask to be repaired next is placed on the stage and electrode 17-1, and the discharge of the preparatory discharge room is started. The above mentioned procedures enable a mask to be repaired rapidly and result in a mask of high quality.

Figure 2:
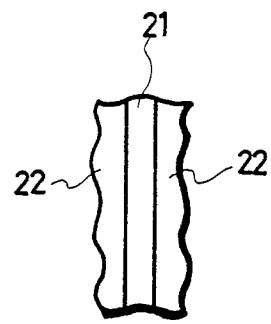
FIG. 2(a) is an explanatory drawing of the film fringes formed on a photomask by the ion beam CVD method.
FIG. 2(b) is an explanatory drawing showing the film fringes removed by oxygen plasma etching.
Figure 2:

The method of mask repairing and the effect of this invention will next be explained with reference to FIGS. 2(a) and (b) which are representations of metallographical microscope photos. FIG. 2(a) shows a film formed by the ion beam assist CVD method. The reference numeral 21 indicates the thicker film portion (hard carbon film) of about 2,000 Angstrom. The reference numeral 22 indicates the thinner film fringe portions attached at the sides of the film and which have a thickness of several tens Angstrom. The conventional method of mask repair is disadvantageous because it produces the unwanted fringe areas 22.

FIG. 2(b) shows the film which has received reactive plasma etching after the hard carbon film has been formed. As shown in FIG. 2(b), the fringe areas at the sides of the film, which are present in FIG. 2(b), have been removed by the plasma etching. Needless to say, the above method can also be used to repair black-spot defects easily by scanning an ion beam instead of directing gas by means of a gas gun.

As particularly stated in the above explanation, the defects of the mask can be completely repaired and a mask of high quality can be obtained by the method of this invention.

In this invention, the fringes of the film are selectively removed after the films are formed by the ion beam assist CVD method. As a result, the contrast of the repaired portion is lowered and, therefore, a mask of high quality can be obtained. Since the process of selectively removing the fringe is conducted by reactive plasma etching, the fringe areas of the film can be removed without damaging the mask.

It has been proved that the hard carbon film meets the strength of adhesion, the degree of light-shielding and the other conditions required for the repaired film. It has also been proved by experimentation that the fringe areas of the film made at the time of forming the hard carbon film can be selectively removed by oxygen plasma etching. (Refer to FIG. 2(b)).

The fringe of the hard carbon film can also be removed by oxidizing and gasifying the film fringe by ozone generated by ultraviolet irradiation.

Though the above description relates to the removal of fringe areas of a patterned film of a photomask, the fringe areas of electric conductive patterns formed by the CVD method using a scanning focused ion beam on the semiconductive substrate can likewise be removed by reactive plasma etching.

I claim:

1. A process for repairing a white-spot defect in the surface of a photomask, comprising the steps of:
providing a patterned photomask having a patterned film on the surface thereof and having a white-spot defect on the surface thereof to be repaired; directing a vapor stream of depositable organic compound onto the photomask surface in the region of the white-spot defect while irradiating the region with a focused ion beam to thereby form a deposited film on the photomask surface, the deposited film having a relatively thicker film portion overlying the white-spot defect and a relatively thinner film fringe portion at the fringe of the thicker film portion; and selectively removing the film fringe portion by reactive plasma etching.

2. A process according to claim 1; wherein the step of selectively removing comprises selectively removing the film fringe portion by oxygen plasma etching.

3. A process according to claim 1; wherein the relatively thinner film fringe portion has a thickness on the order of several tens Å.

4. A process according to claim 1; wherein the deposited film is formed on the photomask surface in a first chamber; and the film fringe portion is removed from the thicker film portion in a second chamber.

5. A process for altering an electrically conductive pattern on the surface of a substrate, comprising the steps of: providing a patterned substrate having an electrically conductive pattern on the surface thereof to be altered; directing a vapor stream of depositable electrically conductive material onto the substrate surface in the region where the pattern is to be altered while irradiating the region with a focused ion beam to thereby form a deposited film on the substrate surface, the deposited film having a relatively thicker film portion overlying the substrate surface where the pattern is to be altered and a relatively thinner film fringe portion at the fringe of the thicker film portion; and selectively removing the film fringe portion by reactive plasma etching.

6. A process according to claim 5; wherein the step of selectively removing comprises selectively removing the film fringe portion by oxygen plasma etching.

7. A process according to claim 5; wherein the relatively thinner film fringe portion has a thickness on the order of several tens Å.

8. A process according to claim 5, wherein the deposited film is formed on the photomask surface in a first chamber; and the film fringe portion is removed from the thicker film portion in a second chamber.

* * * * *